(12) United States Patent
Kwan

(10) Patent No.: US 11,978,830 B2
(45) Date of Patent: May 7, 2024

(54) OPTICALLY TRANSPARENT ADHESION LAYER TO CONNECT NOBLE METALS TO OXIDES

(71) Applicant: Lumileds LLC, San Jose, CA (US)

(72) Inventor: Yue Chau Kwan, Punggol (SG)

(73) Assignee: Lumileds LLC, San Jose, CA (US)

( * ) Notice: Subject to any disclaimer, the term of this patent is extended or adjusted under 35 U.S.C. 154(b) by 19 days.

(21) Appl. No.: 17/372,201

(22) Filed: Jul. 9, 2021

(65) Prior Publication Data

US 2021/0336091 A1    Oct. 28, 2021

Related U.S. Application Data

(63) Continuation of application No. 15/881,140, filed on Jan. 26, 2018, now abandoned.

(51) Int. Cl.
*H01L 33/46* (2010.01)
*H01L 33/32* (2010.01)

(52) U.S. Cl.
CPC ............ *H01L 33/46* (2013.01); *H01L 33/32* (2013.01); *H01L 2933/0025* (2013.01); *H01L 2933/0058* (2013.01)

(58) Field of Classification Search
CPC . H01L 33/02; H01L 33/0025; H01L 33/0075; H01L 33/007; H01L 33/0083; H01L 33/08; H01L 33/10; H01L 33/105; H01L 33/26; H01L 2933/0016; H01L 2933/0025; H01L 2933/0058; H01L 2933/0066; H01L 2924/3651; H01L 2924/12041; H01L 2924/01077; H01L 2924/01079; H01L 2924/01047;
(Continued)

(56) References Cited

U.S. PATENT DOCUMENTS 5,969,419 A    10/1999   Tijburg et al.
6,320,206 B1   11/2001   Coman et al.
(Continued)

FOREIGN PATENT DOCUMENTS

EP    1583159 A2    10/2005
EP    1583159 A3    11/2008
(Continued)

OTHER PUBLICATIONS

The extended European Search Report corresponding to EP 18165085.4 dated Oct. 1, 2018, 7 pages.
(Continued)

*Primary Examiner* — Natalia A Gondarenko

(57) ABSTRACT

A reflective layer for use in lighting devices and methods of forming the reflective layer are provided. The reflective layer may include a dielectric layer including one or more insulating materials. An intermediate layer may be formed on the dielectric layer. The intermediate layer may include one or more materials having a higher enthalpy of reaction than the one or more insulating materials. Because of the higher enthalpy of reaction, atoms of the one or more materials in the intermediate layer may form bonds with atoms of the one or more insulating materials. A metal layer may be formed on the intermediate layer to reflect light emitted from an active region of a light emitting diode (LED).

13 Claims, 9 Drawing Sheets

(58) Field of Classification Search
CPC . H01L 2924/01013; H01L 2224/02122; H01L 2224/05123; H01L 2224/05124; H01L 2224/08111; H01L 2224/08112; H01L 2224/08503; H01L 2224/09103; H01L 2224/82895; H01L 2224/8582; H01L 2224/8589; H01L 2224/8581; H01L 2224/85723; H01L 2224/85724; H01L 2224/8536; H01L 2224/85379; H01L 2224/8336; H01L 2224/83191; H01L 224/85424; H01L 224/85423; H01L 224/85478; H01L 224/85439; H01L 224/84893; H01L 224/84895; H01L 224/8482; H01L 224/8481; H01L 224/83894; H01L 27/14629; H01L 33/382; H01L 33/405; H01L 33/42; H01L 33/46; H01L 33/465; H01L 33/32; H01L 33/54; H01L 33/56; H01L 33/60; H01L 2224/85424; H01L 2224/85423; H01L 2224/85478; H01L 2224/85439; H01L 2224/84893; H01L 2224/84895; H01L 2224/8482; H01L 2224/8481; H01L 2224/83894
USPC ......... 257/79, 81, 98, 99, 199, 89, 535, 753, 257/743, 744, 761, 768, 763
See application file for complete search history.

(56) References Cited

U.S. PATENT DOCUMENTS

| | | |
|---|---|---|
| 6,420,032 B1 | 7/2002 | Iacovangelo |
| 6,420,199 B1 | 7/2002 | Coman et al. |
| 6,593,160 B2 | 7/2003 | Carter-Coman et al. |
| 6,630,689 B2 | 10/2003 | Bhat et al. |
| 6,657,236 B1 | 12/2003 | Thibeault et al. |
| 6,815,818 B2 | 11/2004 | Moore et al. |
| 6,821,804 B2 | 11/2004 | Thibeault et al. |
| 7,141,825 B2 | 11/2006 | Horio et al. |
| 7,344,902 B2 | 3/2008 | Basin et al. |
| 9,142,726 B2 | 9/2015 | David et al. |
| 9,608,168 B2 | 3/2017 | Chae |
| 2005/0233526 A1 | 10/2005 | Watanabe et al. |
| 2007/0058059 A1 | 3/2007 | Suehiro |
| 2010/0117111 A1 | 5/2010 | Illek et al. |
| 2010/0123153 A1 | 5/2010 | Lin et al. |
| 2010/0154213 A1 | 6/2010 | Koike et al. |
| 2011/0260178 A1 | 10/2011 | Bierhuizen |
| 2012/0217530 A1* | 8/2012 | Edmond .................. H01L 33/62 257/E33.066 |
| 2012/0280263 A1 | 11/2012 | Ibbetson et al. |
| 2013/0177274 A1 | 7/2013 | Kosenko et al. |
| 2013/0203194 A1 | 8/2013 | Totani et al. |
| 2014/0327062 A1 | 11/2014 | Park et al. |
| 2015/0280078 A1* | 10/2015 | Yen ........................ H01L 33/505 257/13 |
| 2015/0333241 A1* | 11/2015 | Chen ........................ H01L 33/62 257/93 |
| 2015/0364643 A1* | 12/2015 | Sumitomo .......... H01L 33/0075 438/29 |
| 2015/0364653 A1 | 12/2015 | Chae |
| 2015/0372208 A1 | 12/2015 | Chae et al. |
| 2016/0365496 A1* | 12/2016 | Kuo ........................ H01L 33/38 |
| 2017/0141342 A1* | 5/2017 | Lee ........................ H10K 50/15 |
| 2017/0186917 A1 | 6/2017 | Jeon et al. |
| 2018/0212110 A1* | 7/2018 | Chen ..................... H01L 33/405 |
| 2018/0240950 A1 | 8/2018 | Jang et al. |
| 2019/0067526 A1 | 2/2019 | Kim et al. |
| 2019/0067538 A1* | 2/2019 | Lee ........................ H01L 33/62 |
| 2019/0237629 A1 | 8/2019 | Kwan |
| 2019/0386189 A1 | 12/2019 | Lee et al. |

FOREIGN PATENT DOCUMENTS

| | | |
|---|---|---|
| EP | 2768036 A2 | 8/2014 |
| JP | 2000232253 A | 8/2000 |
| JP | 2012114130 A | 6/2012 |
| KR | 20130068448 A | 6/2013 |
| WO | 2015138274 A2 | 3/2015 |

OTHER PUBLICATIONS

International Search Report corresponding to PCT/US2019/015329 dated Apr. 29, 2019, 3 pages.
Written Opinion of the EPO as the ISA corresponding to PCT/US2019/015329, dated Apr. 29, 2019, 7 pages.

* cited by examiner

OPTICALLY TRANSPARENT ADHESION LAYER TO CONNECT NOBLE METALS TO OXIDES

CROSS REFERENCE TO RELATED APPLICATIONS

This application is a continuation of U.S. application Ser. No. 15/881,140 filed on Jan. 26, 2018, which is incorporated by reference herein in its entirety.

BACKGROUND

Semiconductor light-emitting devices including light emitting diodes (LEDs), resonant cavity light emitting diodes (RCLEDs), vertical cavity laser diodes (VCSELs), and edge emitting lasers are among the most efficient light sources currently available. Materials systems currently of interest in the manufacture of high-brightness light emitting devices capable of operation across the visible spectrum include Group III-V semiconductors, particularly binary, ternary, and quaternary alloys of gallium, aluminum, indium, and nitrogen, also referred to as III-nitride materials.

Typically, III-nitride light emitting devices are fabricated by epitaxially growing a stack of semiconductor layers of different compositions and dopant concentrations on a sapphire, silicon carbide, III-nitride, or other suitable substrate by metal-organic chemical vapor deposition (MOCVD), molecular beam epitaxy (MBE), or other epitaxial techniques. The stack often includes one or more n-type layers doped with, for example, silicon, formed over the substrate, one or more light emitting layers in an active region formed over the n-type layer or layers, and one or more p-type layers doped with, for example, magnesium, formed over the active region. Electrical contacts are formed on the n- and p-type regions.

SUMMARY

A reflective layer for use in lighting devices and methods of forming the reflective layer are provided. The reflective layer may include a dielectric layer including one or more insulating materials. An intermediate layer with robust adhesive properties to the dielectric layer and a subsequent metal layer may be formed on the dielectric layer. The intermediate layer may include one or more materials having a higher enthalpy of reaction than the one or more insulating materials. Because of the higher enthalpy of reaction, atoms of the one or more materials in the intermediate layer may form bonds with atoms of the one or more insulating materials. A metal layer may be formed on the intermediate layer to reflect light emitted from an active region of a light emitting diode (LED).

BRIEF DESCRIPTION OF THE DRAWINGS

A more detailed understanding may be had from the following description, given by way of example in conjunction with the accompanying drawings wherein.

DETAILED DESCRIPTION

Figure 1:
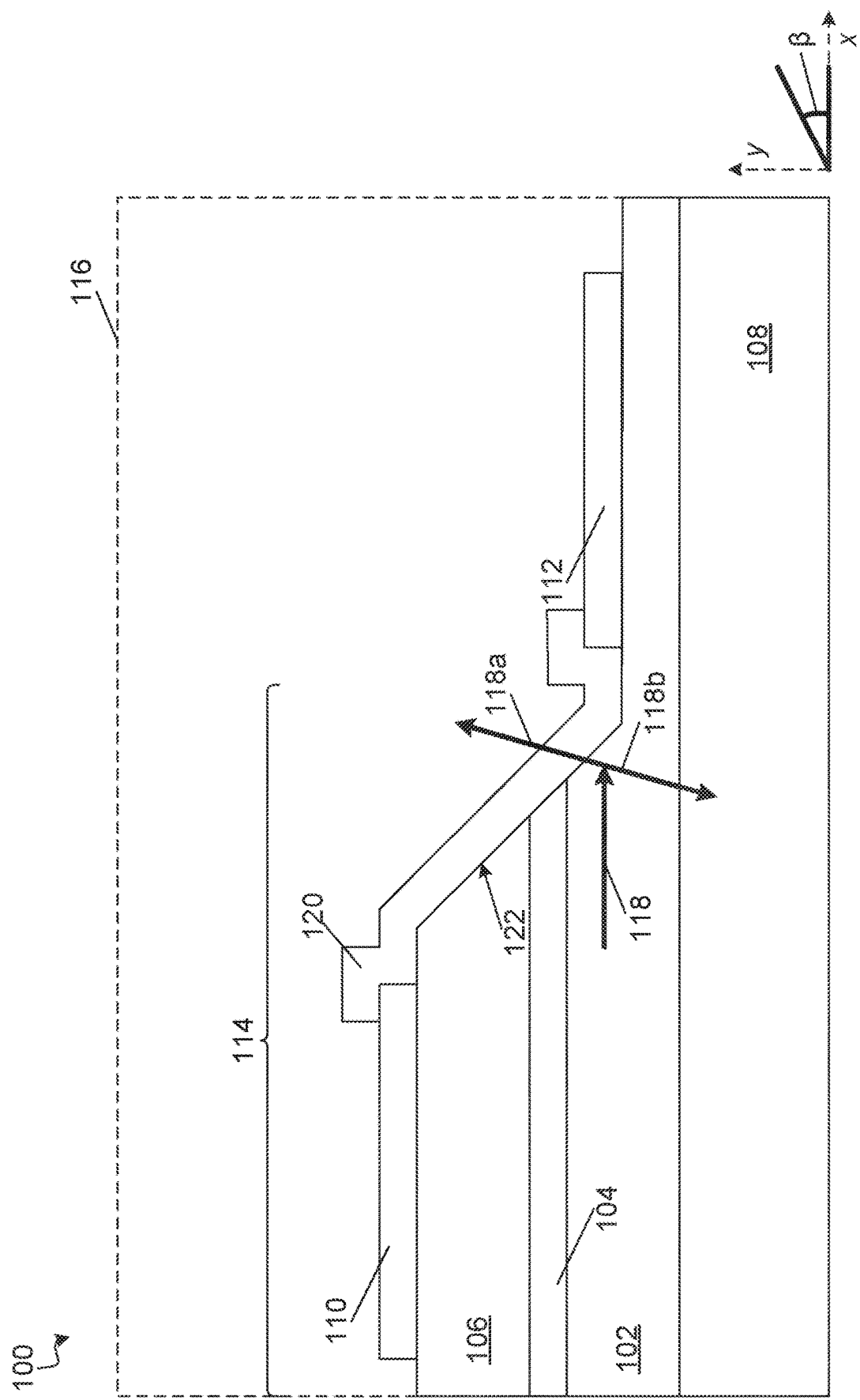
FIG. 1 is a cross-section view illustrating an example III-nitride light emitting diode (LED) device.

Examples of different light emitting diode ("LED") implementations will be described more fully hereinafter with reference to the accompanying drawings. These examples are not mutually exclusive, and features found in one example can be combined with features found in one or more other examples to achieve additional implementations. Accordingly, it will be understood that the examples shown in the accompanying drawings are provided for illustrative purposes only and they are not intended to limit the disclosure in any way. Like numbers refer to like elements throughout.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. It will be understood that these terms are intended to encompass different orientations of the element in addition to any orientation depicted in the figures.

Relative terms such as "below" or "above" or "upper" or "lower" or "horizontal" or "vertical" may be used herein to describe a relationship of one element, layer or region to another element, layer or region as illustrated in the figures. It will be understood that these terms are intended to encompass different orientations of the device in addition to the orientation depicted in the figures.

Semiconductor light-emitting diodes (LEDs) are among the most efficient light sources currently available. Materials used in the manufacture of LEDs capable of operation across the visible spectrum include Group III-V semiconductors, particularly binary, ternary, and quaternary alloys of gallium, aluminum, indium, and nitrogen, which may be referred to as III-nitride materials. Typically, III-nitride devices are epitaxially grown on sapphire, silicon carbide, or III-nitride substrates by metal-organic chemical vapor deposition (MOCVD), molecular beam epitaxy (MBE), or other epitaxial techniques. Some of these substrates are insulating or poorly conducting. Devices fabricated from semiconductor crystals grown on such substrates may have both the positive and the negative polarity electrical contacts to the epitaxially-grown semiconductor on the same side of the device. In contrast, semiconductor devices grown on conducting substrates may be fabricated such that one electrical contact is formed on the epitaxially grown material and the other electrical contact is formed on the substrate. However, devices fabricated on conducting substrates may also be designed to have both contacts on the same side of the device on which the epitaxial material is grown in a flip-chip geometry so as to improve light extraction from LED chip, to improve the current-carrying capacity of the chip, or to improve the heat-sinking of the LED die. In order to fabricate efficient LED devices, the contacts may be electrically isolated from each other such that electrical carriers of the appropriate polarity are injected into the p-type and n-type sides of the semiconductor junction, where they recombine to produce light.

Referring now to FIG. 1, a cross-section view illustrating an example III-nitride LED device 100 is shown. One or more semiconductor layers, including, for example, an n-layer 102, an active region 104, and a p-layer 106 may be epitaxially grown on a substrate 108. A p-contact 110 and an n-contact 112 may be formed on the same side of the device as described above. Electrical isolation between the p-contact 110 and the n-contact 112 may be achieved by etching a mesa structure 114 into the device extending from the topmost layer down into the underlying n-layer 102 and forming a separate defined p-contact 110 and re-contact 112. The LED may be mounted to a submount assembly 116, which may include a submount on which the LED is mounted with solder bumps. The solder bumps may create a gap between the submount and the LED. The connected LED and submount assembly may then be encapsulated in a high index of refraction gel or epoxy.

The high index gel or epoxy may be selected to match an index of refraction of the substrate 108 as closely as possible, since the light produced in the device may be extracted through the substrate 108. When light is incident on an interface between two materials, the difference in index of refraction determines how much light is reflected at that interface, and how much light is transmitted through it. The larger the difference in index of refraction, the more light is reflected. Thus, the small difference between the index of refraction of the sapphire substrate and the high index gel or epoxy encapsulating the device may ensure that most of the light generated in the device that reaches the emitting surfaces of the substrate 108 is extracted from the device.

Photons may be generated within the active region 104. Extracting the photons from the semiconductor active region 104 into the LED package and outside may difficult due, in part, to the high indices of refraction of the semiconductor layers. Photons generated within the epitaxial semiconductor layer may be incident upon either the interface between the semiconductor layers and the substrate 108, the interface of a wall 122 of the mesa 114 and the high index gel or epoxy in the submount assembly 116, or the interface between the semiconductor layers and the metal contacts. Photons incident on any of the three interfaces face a step in material refractive index. Such a step in refractive index may cause a ray 118 incident on such an interface to be split into a transmitted portion 118a and a reflected portion 118b. Light transmitted out from the wall 122 of the mesa 114 (i.e. portion 118a) may not be directed out of the device in a useful direction. Thus, light lost through transmission at the wall 122 of the mesa 114 may contribute to a low light extraction efficiency of the III-nitride LED device 100.

The high index gel or epoxy encapsulating the device may result in a small difference in refractive index at the interface at the wall 122 of the mesa 114 between the semiconductor layers between the contacts and the submount assembly 116. As a result, much of the light incident on this area may be transmitted in the direction of the submount assembly, which may cause significant optical loss. As described above, light extracted in the area towards the submount assembly 116 may not be usefully extracted from the III-nitride LED device 100.

As light propagates through the device, it may be subject to attenuation. Attenuation can occur at all places within the semiconductor, but is likely to be largest at the interfaces, for example between the n-layer 102 and the substrate 108; between the semiconductor layers and the contacts; in the active region 104; and in any nucleation layer present between the n-layer 102 and the substrate 108. The further light propagates, the more it is attenuated. Light rays travelling through the semiconductor layer with a large angle β, the angle of propagation relative to the substrate 108, may require a longer path length to travel a given distance in the semiconductor resolved parallel to the substrate 108 compared with light rays with a small angle β. Each time a ray is reflected, the sign of the angle of propagation may be reversed. For example, a ray propagating at angle β may propagate at an angle $-\beta$ upon reflection. Large angle β rays may pass a greater number of times through the active region 104 and may be reflected off the various interfaces a greater number of times. Each time the ray is reflected, it becomes more attenuated. Such rays may therefore be subject to greater attenuation per unit distance of propagation in the x-direction than rays travelling at shallower angles β. Thus, most of the flux (optical power) incident on the wall 122 of the mesa 114 is incident at shallow angles β. For a device with some absorption in the contacts (e.g., a device with an aluminum p-contact), 70% or more of the total flux incident on the wall 122 of the mesa 114 may be incident at an angle of in the range of approximately $-10$ degrees$<\beta<30$ degrees. For a device with a highly reflective p-contact 110 such as a pure silver p-contact 110, the proportion of flux incident on the wall 122 of the mesa 114 within this same angular range may fall to about 60%.

A reflective layer 120 may be used to reflect light emitted from the active region 104. The reflective layer 120 may compose one or more of dielectric layers, metal stacks, composite mirrors, or distributed Bragg reflectors (DBR). The reflective layer 120 may be formed on the wall 122 of the mesa 114 to maximize the reflection of light incident on the wall 122 of the mesa 114. The reflective layer 120 may include a transparent conducting layer, a dielectric layer, and a metal mirror. A composite mirror may require the metal mirror to be formed directly on the dielectric layer. The metal mirror may compose a noble metal, such as, for example silver (Ag) or gold (Au). The dielectric layer may compose any insulating material, such as, for example, an oxide or nitride of silicon or magnesium fluoride.

It is known in the art that a noble metal, such as Ag, does not adhere well to a dielectric material, such as silicon oxide. The poor adhesion may introduce problems during fabrication processes and may reduce the reflectivity of the reflective layers. An upper surface of the dielectric layer may be roughened prior to deposition of the metal mirror to increase adhesion. The development of surface features and increased surface area of the roughened surface may promote adhesion between the noble metal and dielectric material, However, this may not be enough to ensure proper and/or sufficient adhesion. An adhesion layer may be introduced between the dielectric layer and the metal mirror to increase the adhesion between the two. However, most adhesives layers are optically absorptive and may negatively affect the reflectivity of the reflective layer. Accordingly, it may be desirable to improve the strength of adhesion between the metal mirror and the dielectric layer while minimizing the optical impact on total reflectance of the reflective layer 120.

Figure 2:
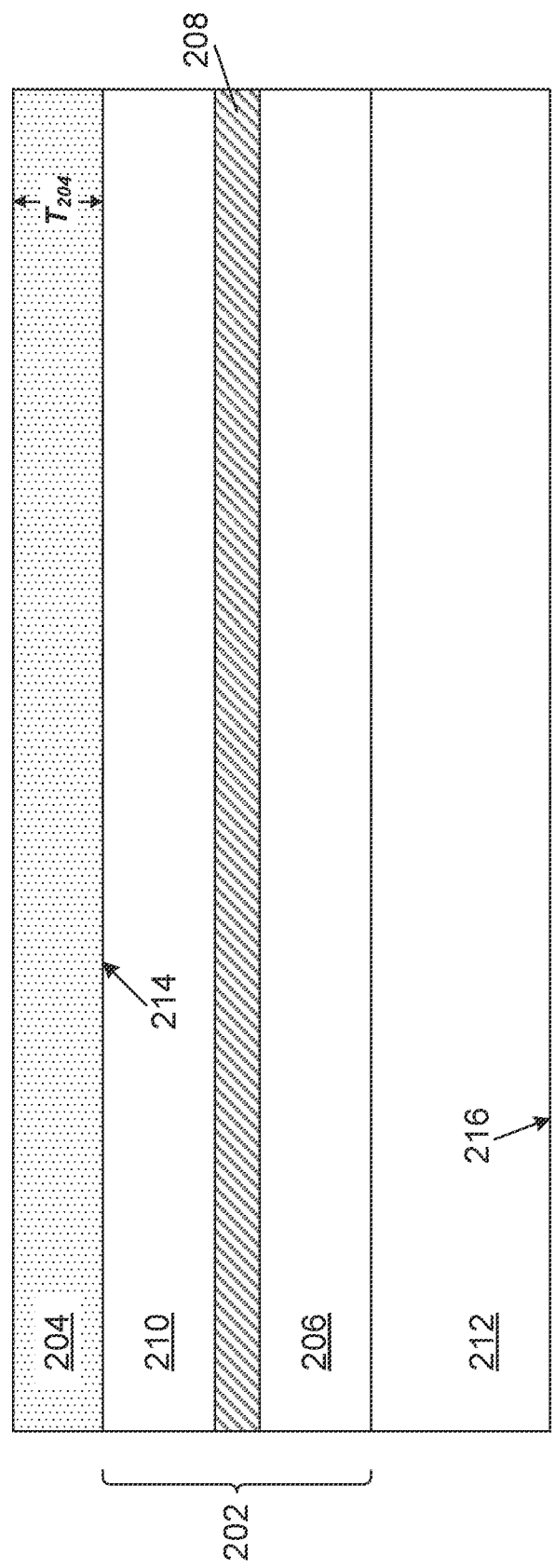
FIG. 2 is a cross-section view illustrating forming a dielectric layer on an emission layer.

Referring now to FIG. 2, a cross-section view illustrating forming a dielectric layer 204 on an emission layer 202 is shown. As described above, the emission layer 202 may contain a first semiconductor layer 206, an active region 208, and a second semiconductor layer 210. The emission layer 202 may be formed on a substrate 212. The substrate 212 may compose silicon or a crystalline material, such as aluminum oxide, and may be a commercial sapphire wafer.

The first semiconductor layer 206 may compose any Group III-V semiconductors, including binary, ternary, and quaternary alloys of gallium, aluminum, indium, and nitrogen, also referred to as III-nitride materials. For example, the first semiconductor layer 402 may compose III-V semiconductors including but not limited to AlN, AlP, AlAs, AlSb, GaN, GaP, GaAs, GaSb, InN, InP, InAs, InSb, II-VI semiconductors including but not limited to ZnS, ZnSe, CdSe, CdTe, group IV semiconductors including but not limited to Ge, Si, SiC, and mixtures or alloys thereof. These semiconductors may have indices of refraction ranging from about 2.4 to about 4.1 at the typical emission wavelengths of LEDs in which they are present. For example, III-nitride semiconductors, such as GaN, may have refractive indices of about 2.4 at 500 nm, and III-phosphide semiconductors, such as InGaP, may have refractive indices of about 3.7 at 600 nm. In an example, the first semiconductor layer 402 may compose GaN.

The first semiconductor layer 206 may be formed using conventional deposition techniques, such as MOCVD, MBE, or other epitaxial techniques. The first semiconductor layer 206 may be doped with n-type dopants.

The second semiconductor layer 210 and the active region 208 may compose any Group III-V semiconductors, including binary, ternary, and quaternary alloys of gallium, aluminum, indium, and nitrogen, also referred to as III-nitride materials. For example, the second semiconductor layer 210 and the active region 210 may compose III-V semiconductors including but not limited to AlN, AlP, AlAs, AlSb, GaN, GaP, GaAs, GaSb, InN, InP, InAs, InSb, II-VI semiconductors including but not limited to ZnS, ZnSe, CdSe, CdTe, group IV semiconductors including but not limited to Ge, Si, SiC, and mixtures or alloys thereof. These semiconductors may have indices of refraction ranging from about 2.4 to about 4.1 at the typical emission wavelengths of LEDs in which they are present. For example, III-nitride semiconductors, such as GaN, may have refractive indices of about 2.4 at 500 nm, and III-phosphide semiconductors, such as InGaP, may have refractive indices of about 3.7 at 600 nm. In an example, the second semiconductor layer 210 and the active region 208 may compose GaN.

The second semiconductor layer 210 and the active region 208 may be formed using conventional deposition techniques, such as MOCVD, MBE, or other epitaxial techniques. The active region 208 and the second semiconductor layer 210 may be formed along with the first semiconductor layer 206 or may be formed separately. The active region 208 and the second semiconductor layer 210 may compose a similar semiconductor material as the first semiconductor layer 206 or their composition may vary.

The second semiconductor layer 210 may be doped with p-type dopants. Accordingly, the active region 208 may be a p-n diode junction associated with the interface of the first semiconductor layer 206 and the second semiconductor layer 210. Alternatively, the active region 208 may include one or more semiconductor layers that are doped n-type, doped p-type, or are undoped. The active region 208 may emit light upon application of a suitable voltage through the first semiconductor layer 206 and the second semiconductor layer 210. In alternative implementations, the conductivity types of the first semiconductor layer 206 and the second semiconductor layer 210 may be reversed. That is, the first semiconductor layer 206 may be a p-type layer and the second semiconductor layer 210 may be an n-type layer.

It should be noted that the emission layer 202 may take any shape. For example, the emission layer 202 may be shaped like a mesa as described above with reference to FIG. 1. In another example, the emission layer 202 may be segmented from other semiconductor layers and may be separated from another emission layer by a trench or an isolation region.

The dielectric layer 204 may be formed on an upper surface 214 of the emission layer 202. The dielectric layer 204 may compose one or more dielectric materials, such as, an oxide, a nitride, or an oxynitride. In an example, the dielectric layer 204 may compose silicon oxide. In another example, the dielectric layer 204 may compose a metal fluoride such as magnesium fluoride. The dielectric layer 204 may be formed using a conventional deposition technique, such as, for example, CVD, plasma enhanced chemical vapor deposition (PECVD), MOCVD, atomic layer deposition (ALD), evaporation, reactive sputtering, chemical solution deposition, spin-on deposition, or other like processes. The dielectric layer 204 may have a thickness $T_{204}$ ranging from approximately 100 nm to approximately 1000 nm. The dielectric layer 204 may be patterned and etched using conventional techniques.

It should be noted that the dielectric layer 204 may be formed on any surface depending on the configuration of the emission layer 202. For example, the dielectric layer 204 may be in contact with the first semiconductor layer 206, the active region 208, and the second semiconductor layer 210 as seen above with reference to FIG. 1. In another example, the dielectric layer 204 may be formed on a lower surface 216 of the substrate 212. In another example, the dielectric layer 204 may be formed on a phosphor region (not shown) formed on the emission layer 202 to wavelength convert emitted light.

Figure 3:
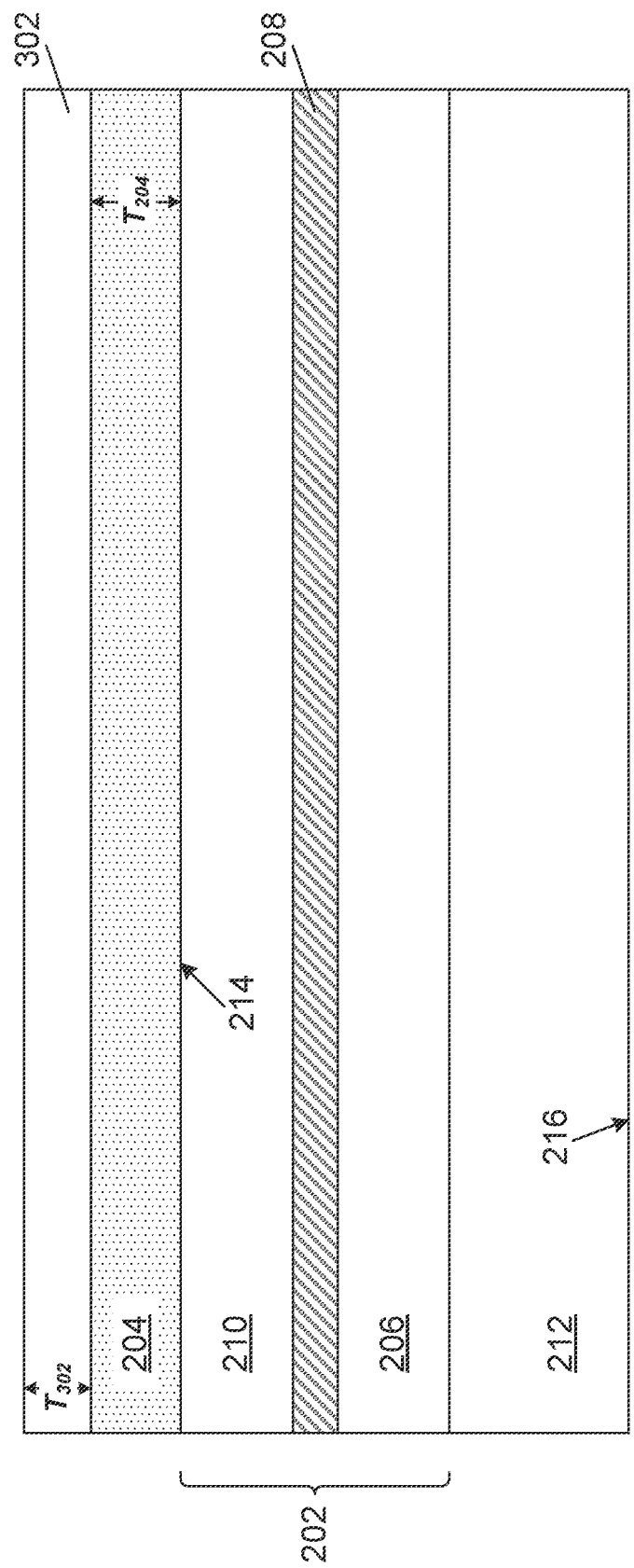
FIG. 3 is a cross section view illustrating forming an intermediate layer on the dielectric layer.

Referring now to FIG. 3, a cross section view illustrating forming an intermediate layer 302 on the dielectric layer 204 is shown. The intermediate layer 302 may compose a material with a higher enthalpy of reaction than the material of the dielectric layer 204. For example, if the dielectric layer 204 includes one or more oxides, the intermediate layer 302 may compose one or more materials having a higher enthalpy of oxidation than the material of the dielectric layer 204. In another example, if the dielectric layer 204 includes fluoride, the intermediate layer 302 may compose one or more materials having a higher enthalpy of fluoridation than the material of the dielectric layer 204.

The intermediate layer 302 may compose atoms of one or more metallic materials, such as for example, Mg, Al, Ge, Ti, Si, Ta, Mn, W, Co, Ni, Cu, Ru, Pd, Pt, and Ag. In an example, the intermediate layer may compose Al, which may have a negative heat of oxide formation of approximately 550 kJ/mol per bond formed to approximately 600 kJ/mol per bond formed. This may be greater than the negative heat of oxide formation of silicon dioxide, which may be approximately 400 kJ/mol per bond formed to approximately 500 kJ/mol per bond formed. The intermediate layer 302 may adhere well to the dielectric layer 204.

The intermediate layer 302 may be formed using a conventional deposition technique, such as, for example, CVD, PECVD, MOCVD, ALD, evaporation, reactive sputtering, chemical solution deposition, plating, spin-on deposition, or other like processes. The intermediate layer 302 may have a thickness $T_{302}$ ranging from approximately 1 angstrom to approximately 50 angstroms. In an example, the intermediate layer 302 may have a thickness $T_{302}$ ranging from approximately 5 angstroms to approximately 20 angstroms.

Figure 4:
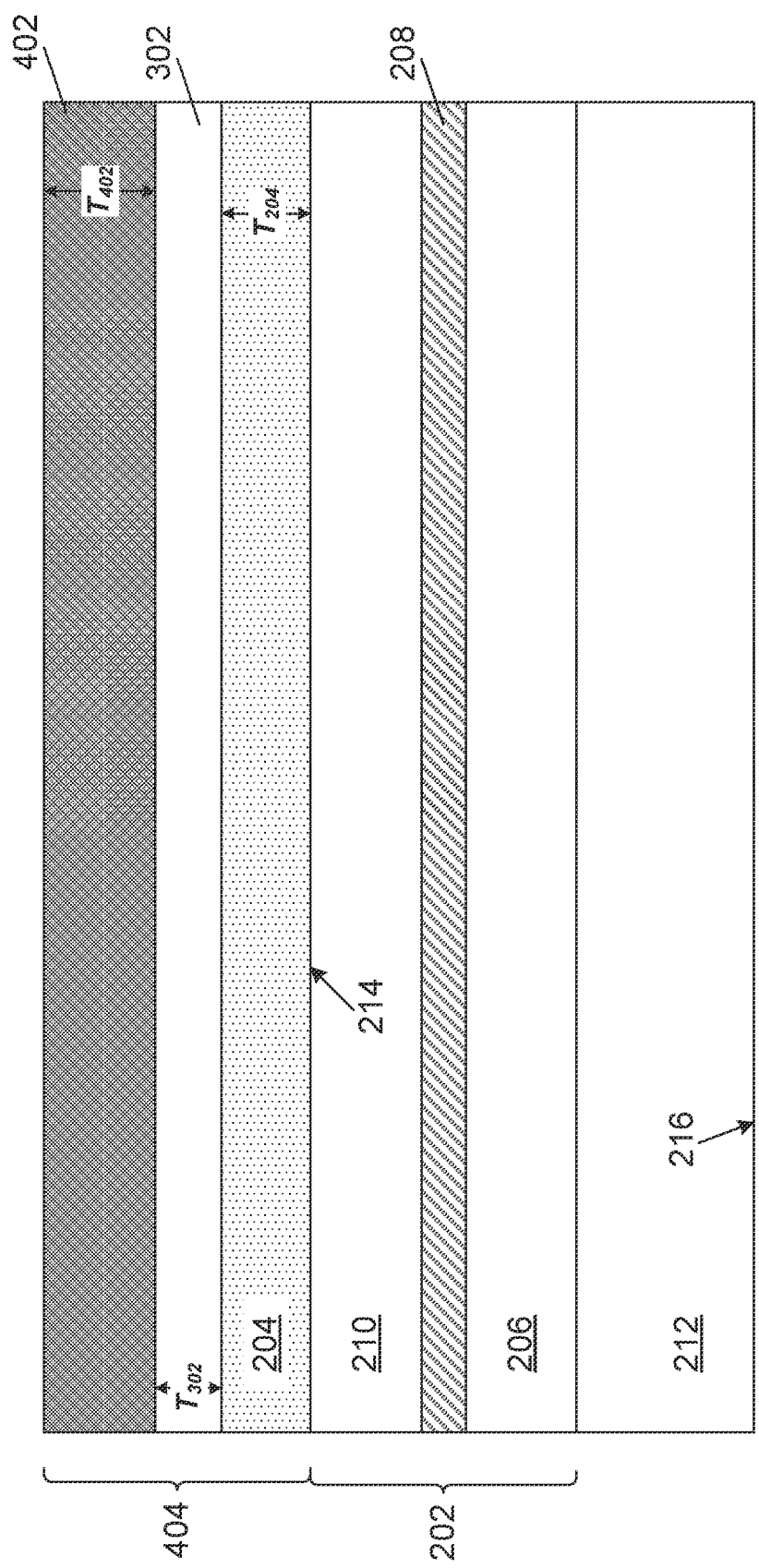
FIG. 4 is a cross section view illustrating forming a metal layer on the intermediate layer to form a reflective layer.

Referring now to FIG. 4, a cross section view illustrating forming a metal layer 402 on the intermediate layer 302 to form a reflective layer 404 is shown. The metal layer 402 may compose one or more metallic materials that reflect light. For example, the metal layer 402 may compose a noble metal, such as Ru, Rh, Pd, Ag, Os, Ir, Pd, and Au. The metal layer 402 may compose stacks of one or more of the metals described above, for example a first stack of at least a first metal, a second stack of at least a second metal, a third stack of at least a third metal, and so on.

The metal layer 402 may be formed using a conventional deposition technique, such as, for example, CVD, PECVD, MOCVD, ALD, evaporation, reactive sputtering, chemical solution deposition, plating, spin-on deposition, or other like processes. The metal layer 402 may have a thickness $T_{402}$ ranging from approximately 50 nm to approximately 1000 nm. The intermediate layer 302 may adhere well to the metal layer 402.

Upon deposition, and/or in subsequent annealing steps, atoms in the intermediate layer 302 may partially react with atoms from the underlying dielectric layer 204 and the intermediate layer 302 may become optically transparent. Because the intermediate layer 302 may have a higher enthalpy of reaction than the underlying dielectric layer 204, the atoms that form the adhesive layer may break bonds between one another and form bonds with atoms in the dielectric layer 204 For example, if Al is used to form the intermediate layer 302 and silicon oxide is used to form the dielectric layer 204, the Al atoms may break the existing Si—O bond in the dielectric layer 204 and form a single Al—O bond. Where the dielectric layer 204 may have had Si—O—Si bonds, it may now contain Si—O—Al bonds with a dangling bond on the Si that may terminate with an Al atom.

The enthalpy of reaction serves as a guide to predict which bonds between the intermediate layer 302 and the dielectric layer 204. In the above example, breaking a Si—O bond and forming an Al—O bond is energetically favorable due to the intermediate layer 302 having a higher enthalpy of oxidation, thereby enabling the adhesion. The thickness $T_{302}$ of the intermediate layer 302 may be sufficient to improve the adhesive force between the dielectric layer 204 and the metal layer 402, but not too thick such that most of the material in the intermediate layer 302 does not react with the underlying dielectric layer 204. As the atoms on the intermediate layer 302 oxidize and react with atoms in the dielectric layer 204, the resulting bonds may produce oxides with a large band gap. This may allow protons emitted from the active region 208 to pass through the dielectric layer 204 and the intermediate layer 302 with little to no resistance and reflect off of the metal layer 402. In other words, because of the large band gap, the dielectric layer 204 and the intermediate layer 302 may be substantially transparent to light emitted from the active region 208.

Figures 5A, 5B:
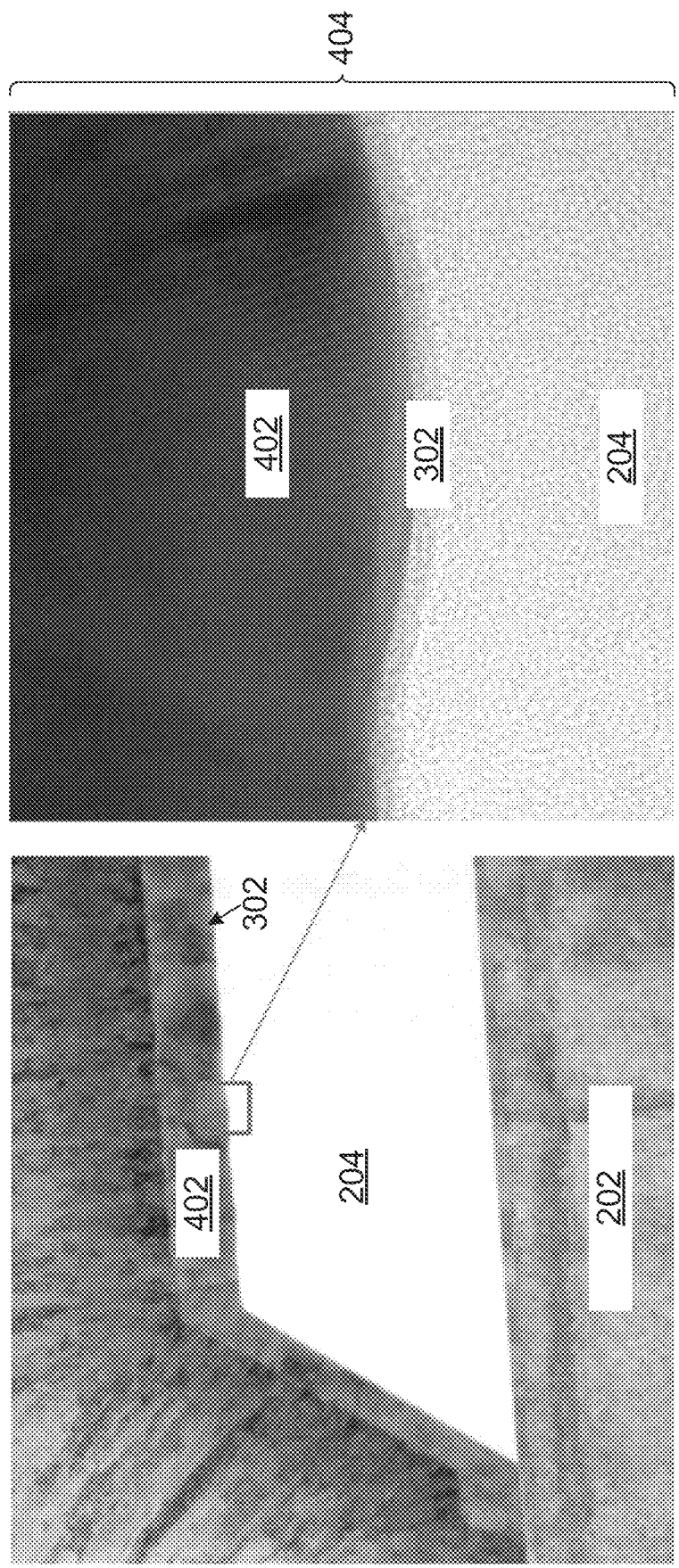
FIGS. 5A-5B are transmission electron microscope (TEM) micrographs illustrating a cross section of an exemplary reflective layer.

Referring now to FIGS. 5A-5B, transmission electron microscope (TEM) micrographs illustrating a cross section of an exemplary reflective layer 404 is shown. FIG. 5A shows the emission layer 202, the dielectric layer 204, the intermediate layer 302, and the metal layer 402. FIG. 5B is a magnification of the reflective layer 404 showing the dielectric layer 204, the intermediate layer 302, and the metal layer 402. As can be seen in FIG. 5B, atoms of the intermediate layer 302 may have reacted with atoms of the dielectric layer 204 to form an adhesive bond.

It should be noted that the FIGS. 1-5B show the reflective layer 404 formed on epitaxially grown GaN, the reflective layer 404 may be used in all optically sensitive interfaces that require good adhesion between a dielectric layer and noble metal. For example, the reflective layer 404 may be formed on any surface of a substrate on which one or more semiconductor layers are formed. In another example, the reflective layer 404 may be formed on a phosphor region used to wavelength convert light emitted from an active region.

Figure 6:
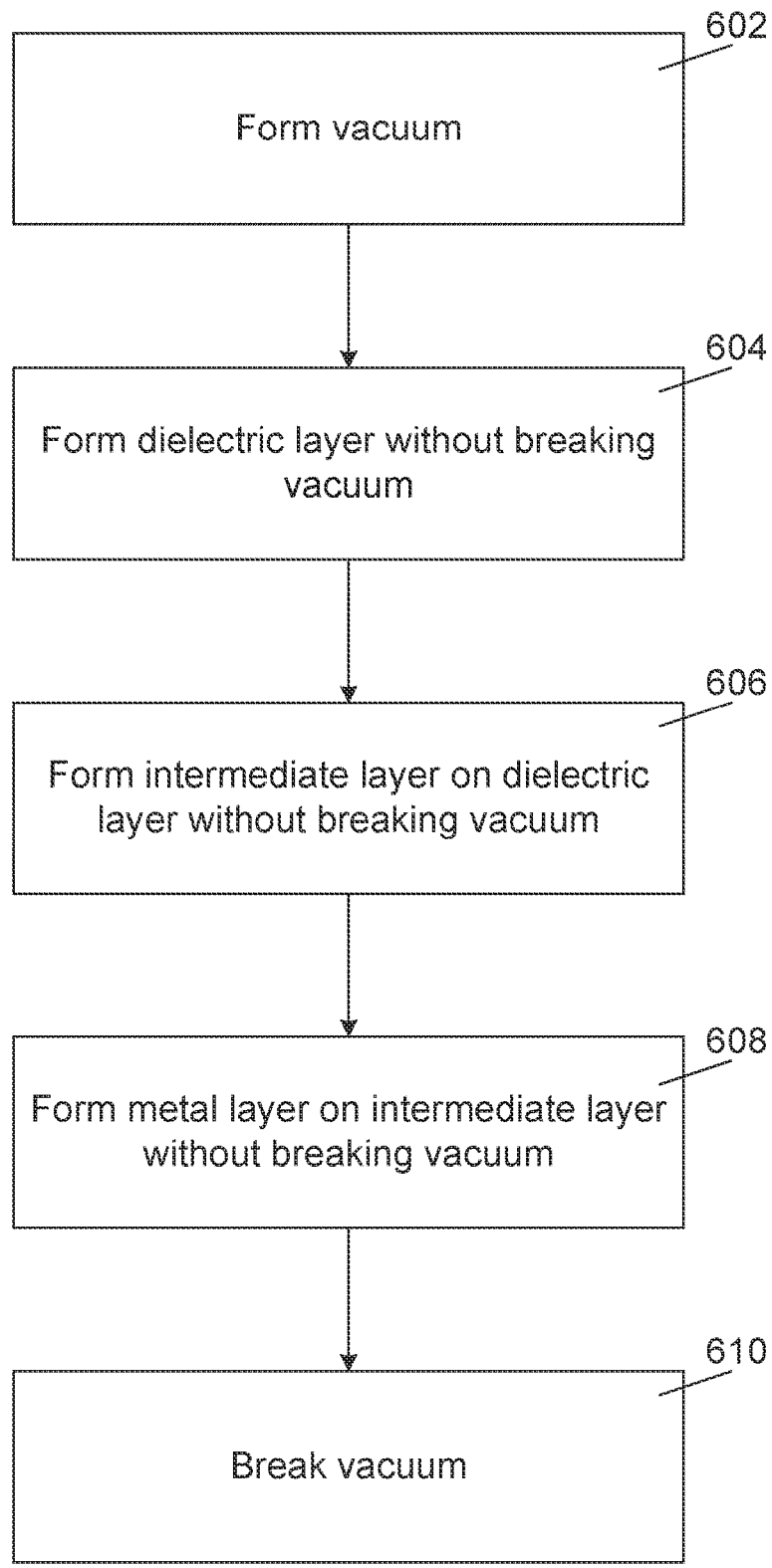
FIG. 6 is a flow chart illustrating a method of forming the reflective layer.

Referring now to FIG. 6, a flow chart illustrating a method of forming the reflective layer 404 is shown. In step 602, a vacuum may be formed. In step 604, the dielectric layer 204 may be formed using one or more of the methods described above without breaking the vacuum. In step 606, the intermediate layer 302 may be formed using one or more methods described above without breaking the vacuum. In step 608, the metal layer 402 may be formed using one or more of the methods described above without breaking the vacuum. In step 610, the vacuum may be broken.

Figure 7:
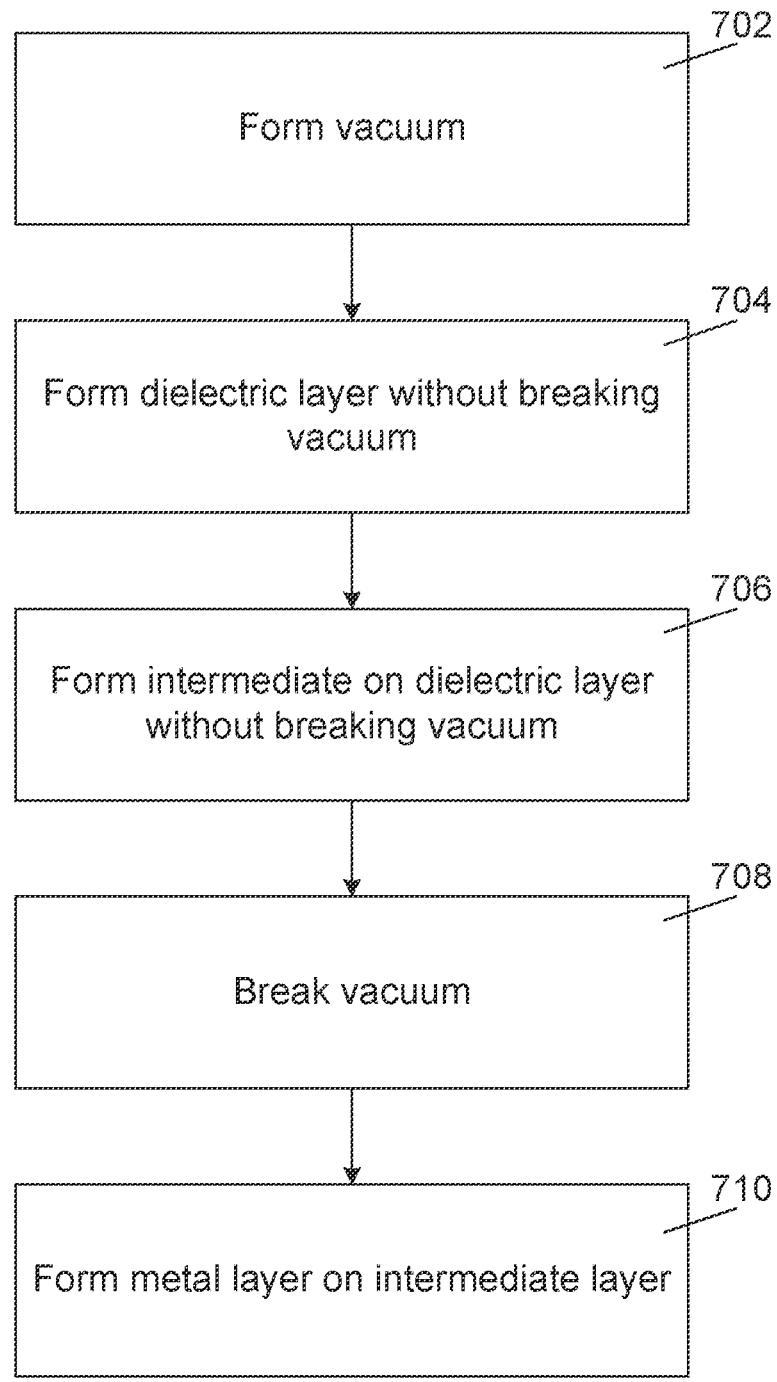
FIG. 7 is a flow chart illustrating another method of forming the reflective layer.

Referring now to FIG. 7, a flow chart illustrating another method of forming the reflective layer 404 is shown. In step 702, a vacuum may be formed. In step 704, the dielectric layer 204 may be formed using one or more of the methods described above without breaking the vacuum. In step 706, the intermediate layer 302 may be formed using one or more methods described above without breaking the vacuum. In step 708, the vacuum may be broken. In step 710, the metal layer 402 may be formed using one or more of the methods described above. In an alternative example, a second vacuum may be formed prior to performing step 710.

Figure 8:
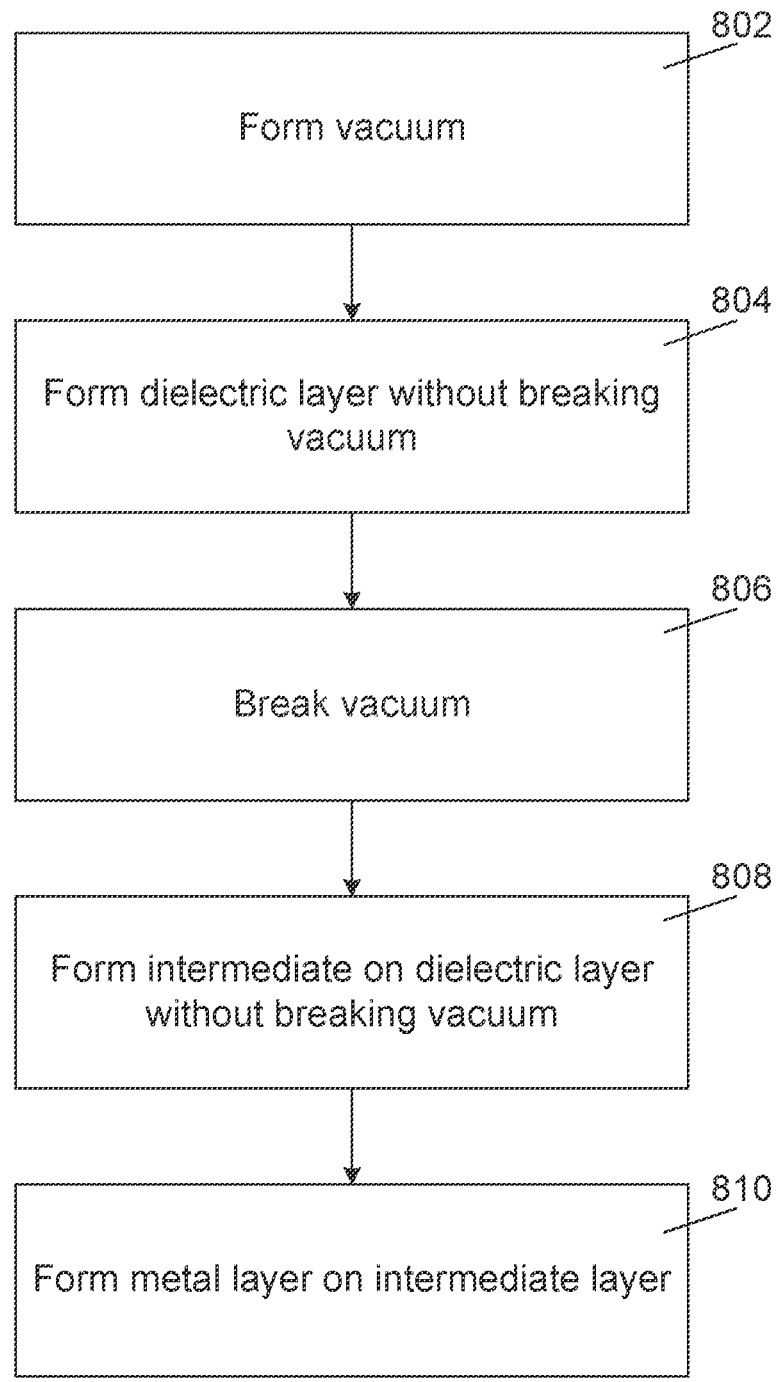
FIG. 8 is a flow chart illustrating another method of forming the reflective layer.

Referring now to FIG. 8, a flow chart illustrating another method of forming the reflective layer 404 is shown. In step 802, a vacuum may be formed. In step 804, the dielectric layer 204 may be formed using one or more of the methods described above without breaking the vacuum. In step 806, the vacuum may be broken. In step 808, the intermediate layer 302 may be formed using one or more methods described above. In step 810, the metal layer 402 may be formed using one or more of the methods described above. In an alternative example, a second vacuum may be formed prior to performing step 808 or step 810.

Figure 9:
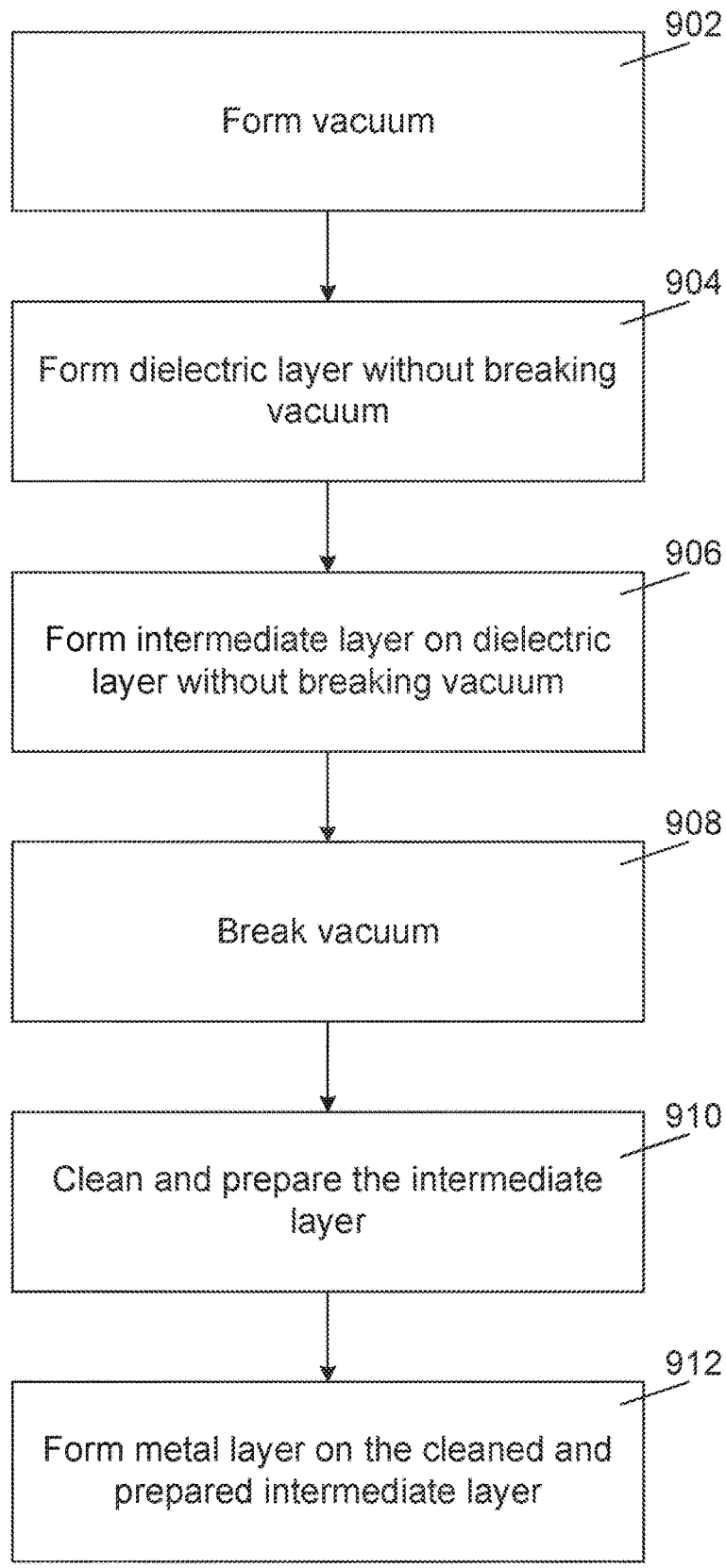
FIG. 9 is a flow chart illustrating another method of forming the reflective layer.

Referring now to FIG. 9, a flow chart illustrating another method of forming the reflective layer 404 is shown. In step 902, a vacuum may be formed. In step 904, the dielectric layer 204 may be formed using one or more of the methods described above without breaking the vacuum. In step 906, the intermediate layer 302 may be formed using one or more methods described above without breaking the vacuum. In step 908, the vacuum may be broken.

Once the vacuum is broken, a native oxide may form on an upper surface of the intermediate layer 302. The native oxide may interfere with adhesion between the intermediate layer 302 and the dielectric layer 204 and/or the metal layer 402. In step 910, the upper surface of the intermediate layer 302 may be cleaned and prepared to remove the layer of the native oxide. The cleaning and preparation may include any conventional washing, etching, or planarization process.

In step 912, the metal layer 402 may be formed after the native oxide is removed using one or more of the methods described above. In an alternative example, a second vacuum may be formed prior to performing step 910 or step 912.

Although features and elements are described above in particular combinations, one of ordinary skill in the art will appreciate that each feature or element can be used alone or in any combination with the other features and elements. In addition, the methods described herein may be implemented in a computer program, software, or firmware incorporated in a computer-readable medium for execution by a computer or processor. Examples of computer-readable media include electronic signals (transmitted over wired or wireless connections) and computer-readable storage media. Examples of computer-readable storage media include, but are not limited to, a read only memory (ROM), a random access memory (RAM), a register, cache memory, semiconductor memory devices, magnetic media such as internal hard disks and removable disks, magneto-optical media, and optical media such as CD-ROM disks, and digital versatile disks (DVDs).

What is claimed is:

1. A light emitting device comprising:
   a semiconductor diode structure including a light emitting layer; and
   a reflective layer disposed on a surface of the semiconductor diode structure, the reflective layer comprising:
      a dielectric layer disposed on the surface of the semiconductor diode structure and comprising an oxide of a first element, the first element having an enthalpy of oxidation less than an enthalpy of oxidation of aluminum;
      an intermediate layer disposed on the dielectric layer and substantially transparent to light emitted by the light emitting layer, comprising unoxidized aluminum as well as an oxide of aluminum, without comprising zinc nor nitrogen;
      a reflective metal layer disposed on the intermediate layer and comprising a first stack of a first metal and a second stack of silver below the first stack in direct contact with the unoxidized aluminum or the oxide of aluminum of the intermediate layer.

2. The light emitting device of claim 1, wherein the light emitting device comprises a pure silver p-contact.

3. The light emitting device of claim 1, wherein the intermediate layer has a thickness of 1 angstrom to 50 angstroms perpendicular to the dielectric layer.

4. The light emitting device of claim 3, wherein the intermediate layer has a thickness of 5 angstroms to 20 angstroms perpendicular to the dielectric layer.

5. The light emitting device of claim 1, wherein the first metal comprises silver.

6. The light emitting device of claim 1, wherein a top surface of the reflective metal layer facing away from the semiconductor diode structure is not in direct contact with dielectric material.

7. The light emitting device of claim 1, wherein the reflective metal layer has a thickness of 50 nm to 1000 nm.

8. The light emitting device of claim 1, wherein the semiconductor diode structure comprises a III-V semiconductor diode structure.

9. The light emitting device of claim 1, wherein the unoxidized aluminum is elemental aluminum.

10. The light emitting device of claim 9, wherein the intermediate layer consists of the elemental aluminum and the oxide of aluminum.

11. The light emitting device of claim 1, wherein the first element is silicon.

12. The light emitting device of claim 11, wherein the intermediate layer has a thickness of 1 angstrom to 50 angstroms perpendicular to the dielectric layer.

13. The light emitting device of claim 11, wherein the semiconductor diode structure comprises a III-Nitride semiconductor diode structure.

\* \* \* \* \*